Jan. 10, 1950 B. A. SCHWARZ ET AL 2,494,008

RADIO TUNING DEVICE

Filed March 31, 1948 2 Sheets-Sheet 1

Inventors

Bertram A. Schwarz,
Howard M. Stelzl &
Manfred G. Wright

By Spencer, Willits, Helwig & Baillio
Attorneys

RADIO TUNING DEVICE

Filed March 31, 1948 2 Sheets-Sheet 2

Inventors
Bertram A. Schwarz,
Howard M. Stelzl &
Manfred G. Wright
By
Spencer, Willits, Helwig & Baillio
Attorneys Patented Jan. 10, 1950

2,494,008

UNITED STATES PATENT OFFICE 2,494,008

RADIO TUNING DEVICE

Bertram A. Schwarz, Howard M. Stelzl, and Manfred G. Wright, Kokomo, Ind., assignors to General Motors Corporation, Detroit, Mich., a corporation of Delaware Application March 31, 1948, Serial No. 18,154

6 Claims. (Cl. 74—10.33)

This invention relates to position indexing means and more particularly to radio tuning means, commonly referred to as push button tuners, and more specifically to the power transfer means between the manual tuning device and the tuning means per se. Inasmuch as the connection between the manual tuning knob of a radio receiver and the movable tuning means therefor must of necessity be of relatively large gear ratio and maintain its adjusted position, it has been common practice to use for this drive a worm wheel and gear. This type of connection provides a relatively large mechanical reduction, and at the same time an irreversible mechanical drive, so that while the manual knob may turn the worm wheel and thus the gear, it is impossible for the gear to drive back through the worm wheel and thus it locks the tuning mechanism in its adjusted position. This is particularly necessary, of course, in automobile sets, where there is considerable vibration of the parts. When push button tuners or automatic tuning is used in conjunction with a manual drive, it is, of course, necessary to disconnect the manual worm wheel drive at such times as the push button is actuated, so that the tuning means per se is unlocked and may be moved to its new position. Also, during resetting periods of one of the push buttons, it is necessary to have the disconnect means or clutch in engagement to hold the device in its newly set position until the mechanism has been locked.

It is therefore an object of our invention to provide suitable disconnect means in a tuning device between the tuning means and the manual tuner.

It is a further object of our invention to provide clutch means between the tuning means and the manual tuner which is automatically operated by operation by any one of the mechanical push buttons.

It is a still further object of our invention to provide clutch means in a radio tuner which releases during normal operation of the push button tuner but remains in engagement in the resetting operation to maintain the tuner in proper position prior to lock-up of the cams.

With these and other objects in view which will become apparent as the specification proceeds, our invention will be best understood by reference to the following specification and claims and the illustrations in the accompanying drawings, in which:

Figure 1:
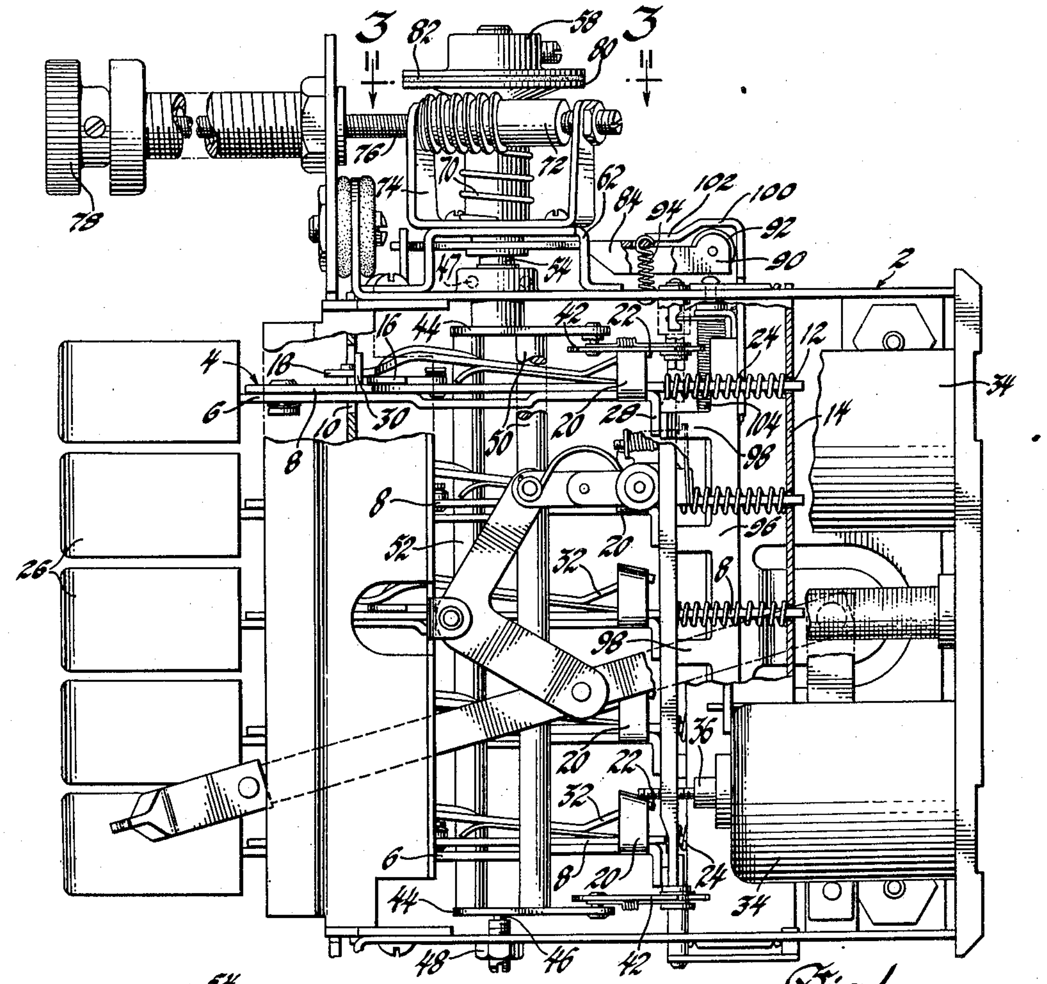
Figure 1 is a top plan view with parts broken away of a tuner for a radio receiver embodying our invention.

In referring to so-called push button tuners, there have been on the market many mechanical types of such indexing means for adjusting radio receivers. Pressure exerted on a button projecting from the set either axially along the shaft supporting the same or pivotally around a pivot to cause an adjusted part to move the tuning means are common constructions used. However, many of these were rather difficult to reset to a new position or readjust to an old one after repeated usage had caused drift. The manually engaged button generally had to be removed and a screw or bolt which thereby became accessible loosened to release an adjustable cam on the reciprocating shaft. Then the station was manually tuned in and the shaft and screw assembly forced inwardly until the adjustable cam came in contact with the turnable means connected to the tuner, and while in this inward pressed position, the screw or bolt had to be tightened. This locked the cam in its adjusted position. This operation not only required the use of both hands of the operator, but also the forcing in of the screw and the tightening of the same simultaneously.

In order to alleviate this situation and to provide a simpler set-up mechanism, we devised a novel tuner which could be unlocked or have one of the adjustable cams freed by pulling outwardly on the associated push button and its shaft, the button in this case being rigidly secured to the shaft, to cause the same to move further out than when in ordinary inactive position. This caused two parts of the shaft assembly to move relatively and unlock the cam carried thereby. This, of course, could be done simply with one hand and is fully shown and described in our Patent No. 2,489,544, issued November 29, 1949, titled Radio tuning means, which patent is directed toward the lock-up means for the cam. After the cam is unlocked, as previously described, the receiver is manually tuned to the station that it is desired to set up for that particular push button. The push button is then forced inwardly, and as it moves the cam first contacts the movable means, which may be in the nature of a treadle bar construction which is secured to the tuning means, and this turns the cam to its proper index. During this time it is desired to maintain the irreversible worm drive in contact and lock the tunng means in position, and it can also be used to make any final small adjustment necessary.

However, as soon as the cam has been indexed, any further inward motion of the push button will cause locking of the cam by means specifically set forth in the above-identified application and to be further described herein. At this point the manual drive should be disconnected from the tuning means, or released, and our construction provides this feature. Also, in normal operation of push button tuners, it is desirable to maintain the manual drive connected to the tuning means, when the set is on station and the tuning buttons are inactive as this locks it in that position. When the operator forces one of the buttons in, the manual means should be substantially immediately released prior to the time that the cam comes into engagement with the treadle bar, so that the same will be as free as possible, and only a small amount of force will be necessary to turn the tuning means to this new position. Immediately upon release of the push button the clutch means should again engage to lock the same in its new position. In other words, the manual tuning means has a second function, namely, that of locking the tuning means in position during reception from a particular station, and during such times as the automatic push buttons are not actuated.

Referring now more specifically to the drawings, the tuner which is used to illustrate our invention comprises a main frame 2 upon which are slidably mounted a plurality of reciprocating assemblies indicated generally at 4. These assemblies are identical and in the main are made up of two parallel bars 6 and 8, which are adapted to be so secured together that they may have relative longitudinal movement. Bar 8 extends substantially the full length of the assembly and is trunnioned in an opening 10 in one of the front transverse frame members and in an opening 12 in the rear transverse frame member 14. On this bar 8 there is pivotally mounted a cam 16, which is the adjustable member. This cam is spring locked against the bar by a member 18, which is pivotally pulled in toward the bar 8 by a strap 20 extending over a projecting end 22 of the member 18 to bias it toward the bar 8 in certain positions. A helical spring 24 is mounted around the projecting inner end of the bar 8 and presses against the inner surface of the transverse member 14 and against a shoulder on the bar 8 to cause the same to be spring biased to its outermost position.

The second bar 6 extends out beyond the bar 8 in front of the tuner and carries a manually engageable push button 26. The inner end of the bar 6 is turned at right angles to provide an engaging foot 28 for clutch operation. The means for locking up the cam 16 as above mentioned is the subject matter of our co-pending application and will not be discussed here in detail except to say that to unlock cam 16 the operator pulls upon push button 26, which causes bar 6 to move outwardly with respect to bar 8 since that can only move out a predetermined amount, due to a stop 30 which engages the front transverse member. Upon the bar 6, therefore, moving outwardly with respect to the bar 8, the cross-strap 20 slides down the incline surface 32 on the spring member 18 and permits the same to rotate outwardly to unlock the cam. In order to now reset the receiver is first manually tuned and, upon pushing inwardly on the button following this unlocking, the cam is brought into indexing position first, or that in which it engages the treadle bar to be described, and then any further movement causes the strap 20 to move up the incline 32 and relock the same.

The tuning means for the receiver in this case has been shown as the comminuted core or permeability tuned type, although it could just as well be any other, and consists of several coil units 34, which are used in conjunction with a plurality of comminuted core units 36, which are supported on a transverse bar 38, and adapted to be moved in or out of the coils as the station position dictates. This transverse member, which is movable longitudinally in slide slots 40, has straight line motion and is moved back and forth by link members 42 on each end, which extend from the upper end of oppositely disposed arms 44, which are pivoted on one end around pivot 46 adjustably held in position by nut 48 and on the opposite end in bearing 47, said arms having extended between them in parallel relation two transverse rods 50 and 52, which are disposed equal distances on opposite sides of the axis and which act as a treadle bar for the cams 16; that is, the push button assembly projects through between these transverse rods, the axis of the cams being substantially that of the treadle bar when in full engagement, so that as the cam points engage one rod or the other, they turn the same to different angular positions.

Figure 2:
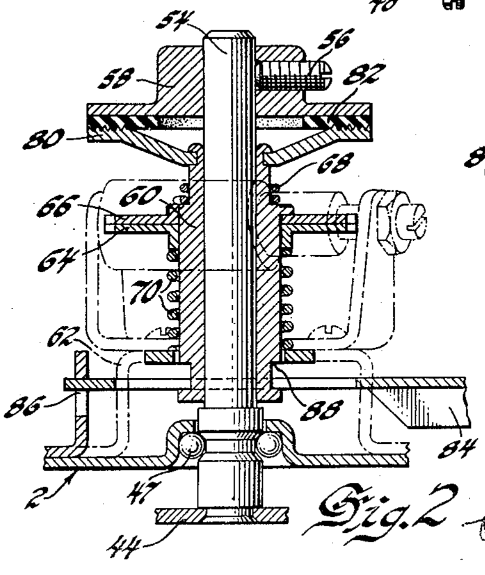
Figure 2 is a sectional view through the clutch drive of our invention.
Figure 3:
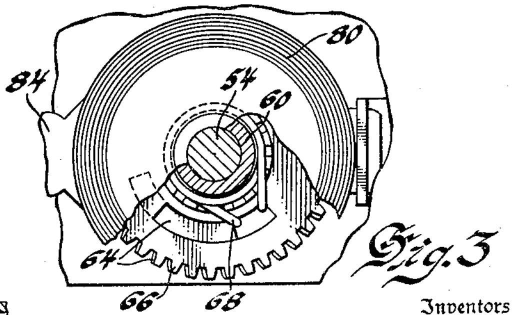
Figure 3 is a sectional view taken on line 3—3 of Figure 1 with parts broken away.
Figure 4:
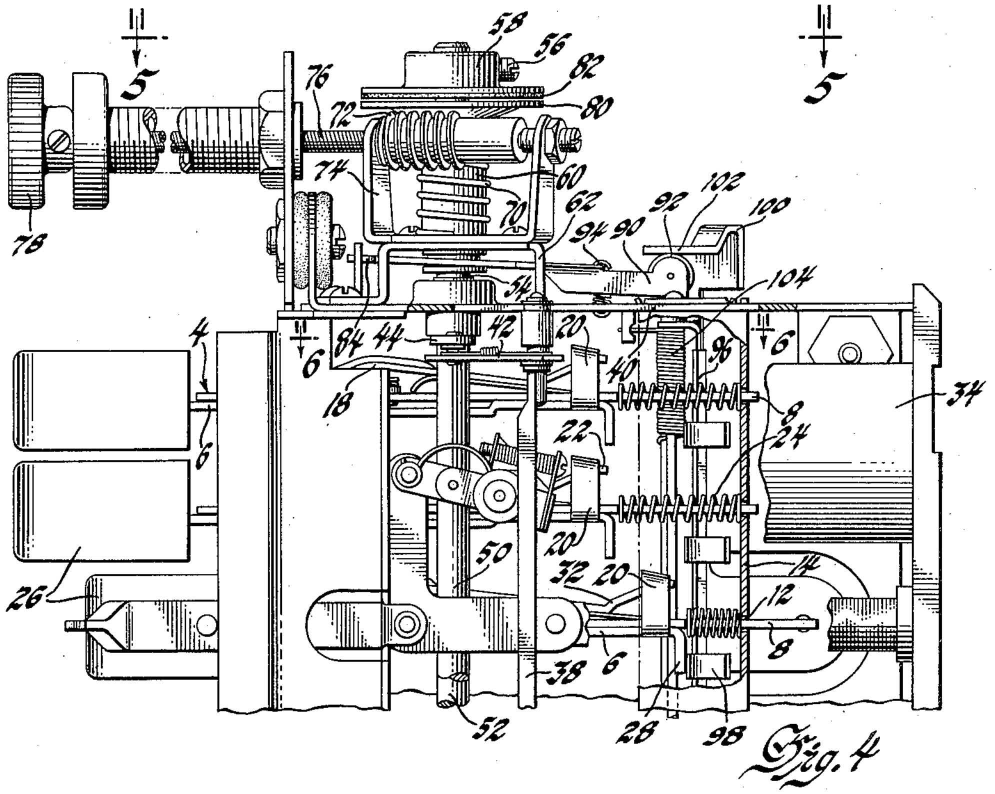
Figure 4 is a top view of the tuner embodying our invention similar to Figure 1, but showing a different position of the operating members.

On one end of the assembly for the treadle bar is a shaft 54 which extends through the bearing 47 in the side plate of the frame, and projects out to some distance from said side member, having rigidly secured to the projecting end by set screw 56 or other suitable securing means a clutch disc 58, which always turns with this shaft. Rotatably mounted around said shaft is a sleeve 60, which has a bearing support in a bracket 62 secured to the side plate. This sleeve has rigidly secured to its outer surface a first gear 64 and rotatably secured a second gear 66 of the same diameter, which is spring loaded by spring 68 for anti-backlash. A helical spring 70 surrounds the sleeve 60 and tends to force it toward an outermost position, as shown in Figure 2. A worm gear 72 rotatably supported in bracket 74, also held by bracket 62, engages the teeth of the combined worm wheel formed by gears 64 and 66, and is turned by flexible wire coupling 76 from the manual knob 78. The outer end of the sleeve 60 carries a clutch plate 80, which is adapted to engage friction lining 82 carried by the first clutch plate 58, so that there will be adequate friction contact. It will thus be evident that there is a continuous mechanical connection between the manual knob 78 and the rotatable sleeve 60, which, if the clutch is in engagement, is transferred to and causes rotation of the shaft 54 and thus the treadle bar assembly and the tuning means is moved but if the clutch 80—58 is disengaged, then it will only rotate the sleeve 60 and no motion will be transmitted to the treadle bar.

Figure 5:
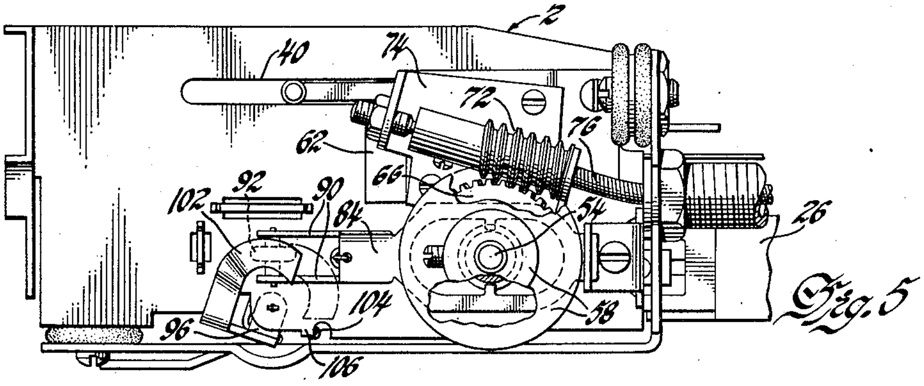
Figure 5 is a view taken on line 5—5 of Figure 4.
Figure 6:
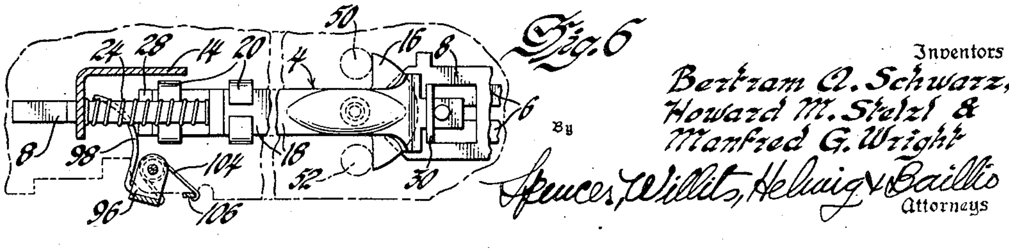
Figure 6 is a sectional view taken on line 6—6 of Figure 4.

The operator for the clutch is means which will move the rotatable sleeve 60 to one side against the force of the spring 70, and this is accomplished by a lever 84, which has one end pivoted in a slot 86 in an angle member on the frame, and which then proceeds to encircle a circular groove 88 in the sleeve 60 to form a collar, the outer end of which member is turned to form two parallel sides 90 which supports a small roller 92 therein. This member has a small spring 94 tending to spring bias this end toward the frame, but this spring is much weaker than spring 70 in compression. To cause this arm to pivot and to move one of the clutch plates, there is provided a transverse rotating member 96, which lies below and to the rear of the reciprocating assemblies and is pivotally mounted in opposite sides of the frame and has a series of spaced fingers 98 which project toward the feet 28 of the reciprocating assemblies and which are adapted to be engaged by the same in certain positions, and also an angled end 100 which extends out around the roller 92 and the angled end 102 of which is adapted to engage the roller as the assembly rotates upon pressure exerted on any one of the fingers 98. This assembly is spring biased in a clockwise direction as shown in Figure 5 or Figure 6 by a coil spring 104, wound around a portion of the member and having its end snapped over stop 106 on the frame. Figure 5 illustrates the contour of the operating end 102 where it is best shown, the dotted line position being the one in which it does not engage the roller 92 and the clutch is in contact, and the full line position being that in which it engages the roller 92 and forces the arm 84 to move the sleeve 60 against the force of the spring 70 to disengage the clutch plates. Figure 6 best illustrates the turning operation of the member 96 when one of the feet 28 of one of the reciprocating assemblies engages its associated curved finger 98 of the number 96 to cause the member to turn upon reciprocation of the assembly.

To best understand the operation of the device, reverting to a previous statement for the moment, it is desirable to normally have the tuning construction, namely the transverse bar 38 and the associated treadle bars, normally locked in an adjusted position, and this is accomplished by having the manual knob secured thereto through the friction clutch under ordinary circumstances. The worm drive is irreversible and after the knob 78 has been turned to bring in a desired station, the mechanism will remain substantially in place. If, however, it is desired to move the tuning means to a new position by one of the push buttons, then the first thing that is desired is to disconnect the manual drive so that the treadle bar and transverse bar only may be easily moved by the cam. Therefore, the initial movement of the reciprocating assembly causes the foot 28 of the same to force against the finger 98 and cause member 96 to rotate, bringing arm 102 up over wheel 92 to disconnect the clutch. Thereafter, any further movement of the reciprocating assembly will bring its cam 16 into engagement with the treadle bar transverse rods 50 and 52 to index the same. Upon return of the push button to its initial position, the clutch will again engage and lock the same in its new position.

Assuming for the moment that it is desired to reset the cam 16 to a new station instead of merely to index the mechanism to the station already set, the associated push button 26 is pulled outwardly, which causes relative motion between bars 6 and 8 and unlocks cam 16. The two bars are then in their extended positions. The clutch 80—58 is in engagement and the operator can now set the receiver to receive the desired station to be set up. The operator then begins to force the assembly back into its innermost position, but the friction between the bars 6 and 8 is sufficient to keep them in extended position temporarily. The first thing that occurs is that cam 16 engages the treadle bar transverse rods 50 and 52 to reset the cam to its new position. Up to this time it is desired to keep the mechanism locked and the clutch in contact. After the cam is indexed, it is then necessary to lock the same and this is caused by further inward movement by the push button, which only carries with it now bar 6, as bar 8 has stopped. This relative motion causes strap 20 to ride up on the surface 32 of the member 18, which locks the cam 16 and at the same time foot 28 presses against finger 98 to disengage the clutch and permit the tuning means to turn. Thereafter, the button is released and repeated operations follow the same pattern as previously described.

It is thus evident that our construction provides for locking the mechanism in position as desired and automatically releases the same at such times as is necessary for automatic operation.

We claim:

1. In means for tuning a radio receiver, an adjustably positionable member secured to the tuning means for the receiver, manual drive means for moving said member, clutch means interposed between the manual drive and the member so that the latter may be disconnected, a plurality of assemblies mounted for reciprocating movement toward the member each assembly including a plurality of slides having limited relative longitudinal movement, adjustable cam means on one of the slides of each assembly to selectively contact the positionable member upon movement toward the same, locking means for the cams on said slides actuated by relative movement of the same and clutch operating means engageable by one slide of any of the reciprocating assemblies as it is forced inwardly to operate the clutch and disconnect the manual drive so that small rotative forces may turn the member.

2. In means for tuning a radio receiver, an adjustably positionable member connected to said tuning means, manually engageable rotatable means, a plurality of reciprocating assemblies mounted toward the member each assembly including a plurality of slides having limited relative longitudinal movement, adjustable cams on each reciprocating assembly to engage the member to move the same, irreversible drive means between the member and the rotatable means, clutch means interposed in the drive means between the irreversible means and the positionable member and clutch operating means actuated by movement of any one of the reciprocating assemblies when said slides are at one limit of their relative motion but incapable of clutch actuation when at the other limit of movement as the assembly moves inwardly to cause clutch separation and disconnect the irreversible drive.

3. In means for tuning a radio receiver, a rotatable member connected to the tuning means to move the same, manually rotatable means, a worm gear connected to said means, a worm wheel engaging said gear, clutch means connected to said wheel and to said rotatable member to transfer motion from one to the other, mounting means for said worm wheel so that it may both rotate and move axially to a limited degree, said axial movement causing clutch actuation.

4. In means for tuning a radio receiver, a rotatable member connected to the tuning means to move the same, manually rotatable means, a worm gear connected to said means, a worm wheel engaging said gear, clutch means connected to said wheel and to said rotatable member to transfer motion from one to the other, mounting means for said worm wheel so that it may both rotate and move axially to a limited degree, said axial movement causing clutch actuation, a plurality of reciprocating assemblies each including an adjustable cam mounted to move in a plane normal to the rotatable member to force the cam carried thereby against the same, said assemblies including two bars capable of relative longitudinal movement but normally locked for simultaneous movement, a projection on one of said bars, and clutch operating means mounted to be engaged by any of said projections if said bars are locked as the assembly is moved inwardly to actuate the clutch and disengage the manual drive so that the cam may index the tuning means.

5. In means for tuning a radio receiver, an adjustable positionable member secured to the tuning means for the receiver, a plurality of assemblies mounted for reciprocating movement toward the member and axially spaced along the same, said assemblies including two parts having a limited amount of relative longitudinal motion, a cam adjustably mounted on one part of each assembly to engage the member upon movement toward the same, locking means for the cams on the parts actuated by relative movement between the two parts, manual drive means, clutch means between the manual drive means and the member, clutch operating means and a projection from each of the assembly parts not carrying the cam for engaging the clutch operating means when the assembly is moved toward the member, the de-clutching action being varied by the relative position of the two parts of the assemblies.

6. In means for tuning a radio receiver, an adjustable positionable member secured to the tuning means for the receiver, manually rotatable means including an irreversible drive, clutch means interconnecting said manually rotatable means with said positionable member, a plurality of tuning assemblies mounted for reciprocating movement toward the member and axially spaced along its length, each assembly including a plurality of parts having a limited amount of relative longitudinal movement, adjustable cam means mounted on one of the parts of each assembly, means on each assembly for locking the cam against movement and actuated by relative movement of said parts to one extremity of said movement to lock the cam and to the other extremity to unlock the same, means for disengaging said clutch and means for actuating the disengaging means for the clutch on one of the parts on each assembly, so located that if the parts are locked together to lock the adjustable cam in place, the clutch disengaging means will be operated, but if the cam is unlocked and the assembly parts are at the other extreme of their relative motion, the clutch actuating means will not be moved.

BERTRAM A. SCHWARZ.
HOWARD M. STELZL.
MANFRED G. WRIGHT.

REFERENCES CITED

The following references are of record in the file of this patent:

UNITED STATES PATENTS

| Number | Name | Date |
|---|---|---|
| 2,266,711 | Crosby et al. | Dec. 16, 1941 |
| 2,310,003 | Wells | Feb. 2, 1943 |
| 2,372,099 | McGarvey | Mar. 20, 1945 |

Certificate of Correction

Patent No. 2,494,008 January 10, 1950

BERTRAM A. SCHWARZ ET AL.

It is hereby certified that error appears in the printed specification of the above numbered patent requiring correction as follows:

Column 6, line 49, after the word "mounted" insert *to move*;

and that the said Letters Patent should be read with this correction therein that the same may conform to the record of the case in the Patent Office.

Signed and sealed this 16th day of May, A. D. 1950.

[SEAL]

THOMAS F. MURPHY,
*Assistant Commissioner of Patents.*